United States Patent
Lim

(10) Patent No.: US 7,447,489 B2
(45) Date of Patent: Nov. 4, 2008

(54) DIGITAL TUNER

(75) Inventor: Hyun-Woo Lim, Jeonrabok-do (KR)

(73) Assignee: LG Innotek Co., Ltd., Seoul (KR)

( * ) Notice: Subject to any disclaimer, the term of this patent is extended or adjusted under 35 U.S.C. 154(b) by 438 days.

(21) Appl. No.: 10/553,055

(22) PCT Filed: Nov. 4, 2004

(86) PCT No.: PCT/KR2004/002824

§ 371 (c)(1),
(2), (4) Date: Oct. 12, 2005

(87) PCT Pub. No.: WO2005/048593

PCT Pub. Date: May 26, 2005

(65) Prior Publication Data

US 2006/0286952 A1    Dec. 21, 2006

(30) Foreign Application Priority Data

Nov. 12, 2003   (KR)  .................. 10-2003-0079690

(51) Int. Cl.
*H04B 1/18* (2006.01)
(52) U.S. Cl. ............... 455/191.1; 455/150.1; 455/188.1
(58) Field of Classification Search ............... 455/191.1, 455/188.1, 150.1, 179.1, 180.1; 348/E5.002, 348/552, 563; 725/87, 131, 105, 109
See application file for complete search history.

(56) References Cited

U.S. PATENT DOCUMENTS

| | | | | |
|---|---|---|---|---|
| 5,357,276 A * | 10/1994 | Banker et al. | ............... | 725/102 |
| 6,052,569 A | 4/2000 | Ehrhardt | | |
| 6,661,464 B1 * | 12/2003 | Kokkosoulis et al. | ........ | 348/448 |
| 6,751,449 B1 * | 6/2004 | Hohmann et al. | ......... | 455/188.1 |
| 7,113,760 B1 * | 9/2006 | Petrov et al. | ................. | 455/324 |
| 7,240,217 B2 * | 7/2007 | Bacon et al. | ................. | 713/189 |
| 2003/0093812 A1 * | 5/2003 | Chang et al. | ................. | 725/133 |
| 2003/0133049 A1 * | 7/2003 | Cowley et al. | ............... | 348/731 |
| 2005/0210501 A1 * | 9/2005 | Zigmond et al. | .............. | 725/32 |
| 2005/0210525 A1 * | 9/2005 | Carle et al. | .................. | 725/105 |

FOREIGN PATENT DOCUMENTS

| | | |
|---|---|---|
| EP | 1317073 A1 | 9/2000 |
| JP | 15101421 A | 4/2003 |
| WO | WO-98/32233 A2 | 7/1998 |

* cited by examiner

*Primary Examiner*—Sonny Trinh
(74) *Attorney, Agent, or Firm*—Birch, Stewart, Kolasch & Birch, LLP

(57) ABSTRACT

A digital tuner of a digital broadcast receiver provided. The digital tuner includes: an IB IF unit for converting an IB signal of the RF signal output into an ID IF signal; an OOB IF unit for converting an OOB signal of the RF signal output into an OOB IF signal. The IB signal and the OOB signal are simultaneously converted into IF signals prior to detection, whereby a digital broadcast signal can be smoothly received.

17 Claims, 4 Drawing Sheets

DIGITAL TUNER

TECHNICAL FIELD

The present invention relates to a digital tuner, and more particularly, to a digital tuner with a built-in OOB mixer circuit, which finally outputs OOB IF signals to thereby make it possible to improve a user's convenience and its own function.

BACKGROUND ART

In general, a broadcast station system compresses signals for digital broadcast, such as a video signal, an audio signal and a control signal, and transmits the compressed digital signals by using a digital television (DTV) transmitter. Here, the DTV transmitter transmits the compressed digital signals by using a radio channel assigned to the broadcast station system. Upon receipt of the compressed digital signals from the DTV transmitter, a DTV receiver decompresses the compressed digital signals, extracts video/audio signals from the decompressed signals and reproduces the extracted video/audio signals respective by its screen and speaker.

In the meantime, the DTV receiver is equipped with a tuner, and the tuner receives radio frequency (RF) signals through an antenna, converts the RF signals into intermediate frequency (IF) signals and divides the IF signals into video signals and audio signals. According to modulation schemes, the tuner is divided into an analog tuner and a digital tuner, and the digital tuner is sub-divided into a quadrature amplitude modulation (QAM) tuner for a cable broadcast, an orthogonal frequency division multiplexing (OFDM) tuner and a vestigial sideband (VSB) tuner for a terrestrial broadcast.

In the meantime, a digital broadcast system enables bi-directional communication between a service provider and an end user to thereby make it possible to enhance a security function and to reasonably collect viewing fees. For complete bi-directional communication, an out-of-band (OOB) tuner for transmitting data from the service provider to the end user and a return path tuner for transmitting data from the end user to the service provider should be provided to the digital broadcast system. The present invention is particularly directed to a function of the OOB tuner.

The prior art digital tuner allows a data transmission from the service provider to the end user by using a frequency band of 100 through 350 MHz different from that of audio/video signals. For this, the prior art digital tuner is equipped with an OOB output line through which signals of the above frequency band is outputted therefrom. However, the OOB output line is extended from one of output ports of a splitter, and an RF output signal of the splitter is outputted through the OOB output line. Accordingly, a set in which the digital tuner is installed should be equipped with a additional OOB mixer circuit for mixing the RF signal outputted through the OOB output line into an IF signal.

Also, the installation of the additional OOB mixer circuit in the set increases a manufacturing cost of the set and makes it difficult to manufacture the set.

DISCLOSURE

Technical Problem

Accordingly, the present invention is directed to a digital tuner that substantially obviate one or more of the problems due to limitations and disadvantages of the related art.

An object of the present invention is to provide a digital tuner with a built-in OOB mixer circuit, which finally and simultaneously outputs OOB IF signals and IB IF signals to thereby make it possible to increase a user's convenience.

Another object of the present invention is to provide a digital tuner with a built-in OOB mixer circuit, which itself outputs OOB IF signals to thereby make it possible to conveniently manufacture a set in which the digital tuner is built.

A further object of the present invention is to provide a digital tuner having a built-in OOB mixer circuit and being attachable to different kinds of sets, which enables mass production thereof to thereby make it possible to reduce a manufacturing cost of each set in which the digital tuner is built.

Technical Solution

To achieve these and other advantages and in accordance with the purpose of the present invention, as embodied and broadly described herein, a digital tuner includes: a splitter for splitting a received RF signal into several RF signal outputs; an IB IF unit for converting an IB signal of the RF signal output into an IB IF signal; an OOB IF unit for converting an OOB signal of the RF signal output into an OOB IF signal.

In another aspect of the present invention, a digital tuner includes: a splitter for splitting a signal; a filter for passing only a signal of a predetermined band or below out of an RF signal received through the splitter; an attenuator for attenuating a level of an RF signal outputted from the filter; an OOB mixer for mixing a signal received through the attenuator and an oscillation frequency signal received from an outside into an OOB IF signal; an OOB IF filter for passing only a signal of a desired band out of the OOB IF signal outputted from the OOB mixer; and an OOB IF amplifier for amplifying an OOB IF signal outputted from the OOB IF filter into an OOB IF signal of a desired level.

In a further aspect of the present invention, a digital tuner includes: a filter for passing only a signal of a predetermined band or below out of an RF signal; an attenuator for attenuating a level of an RF signal outputted from the filter; an OOB mixer for mixing a signal received through the attenuator and an oscillation frequency signal received from an outside into an OOB IF signal; an OOB IF filter for passing only a signal of a desired band out of the OOB IF signal outputted prom the OOB mixer; and an OOB IF amplifier for amplifying an OOB IF signal outputted from the OOB IF filter into an OOB IF signal of a desired level and outputting the amplified OOB IF signal through an OOB output line thereof.

In a further another aspect of the present invention, a digital tuner includes: a splitter for splitting a received signal into several line signals; an OOB IF unit connected to at least one of output lines of the splitter, for converting an OOB signal into an IF signal.

Advantageous Effects

The present invention embodies an OOB mixer circuit in a digital tuner, thereby making it possible to conveniently manufacture a set in which the digital tuner is built, and also to reduce a manufacturing cost of the set.

BEST MODE FOR CARRYING OUT THE INVENTION

Reference will now be made in detail to the preferred embodiments of the present invention, examples of which are illustrated in the accompanying drawings. Wherever possible, the same reference numbers will be used throughout the drawings to refer to the same or like parts.

First Embodiment

Figure 1:
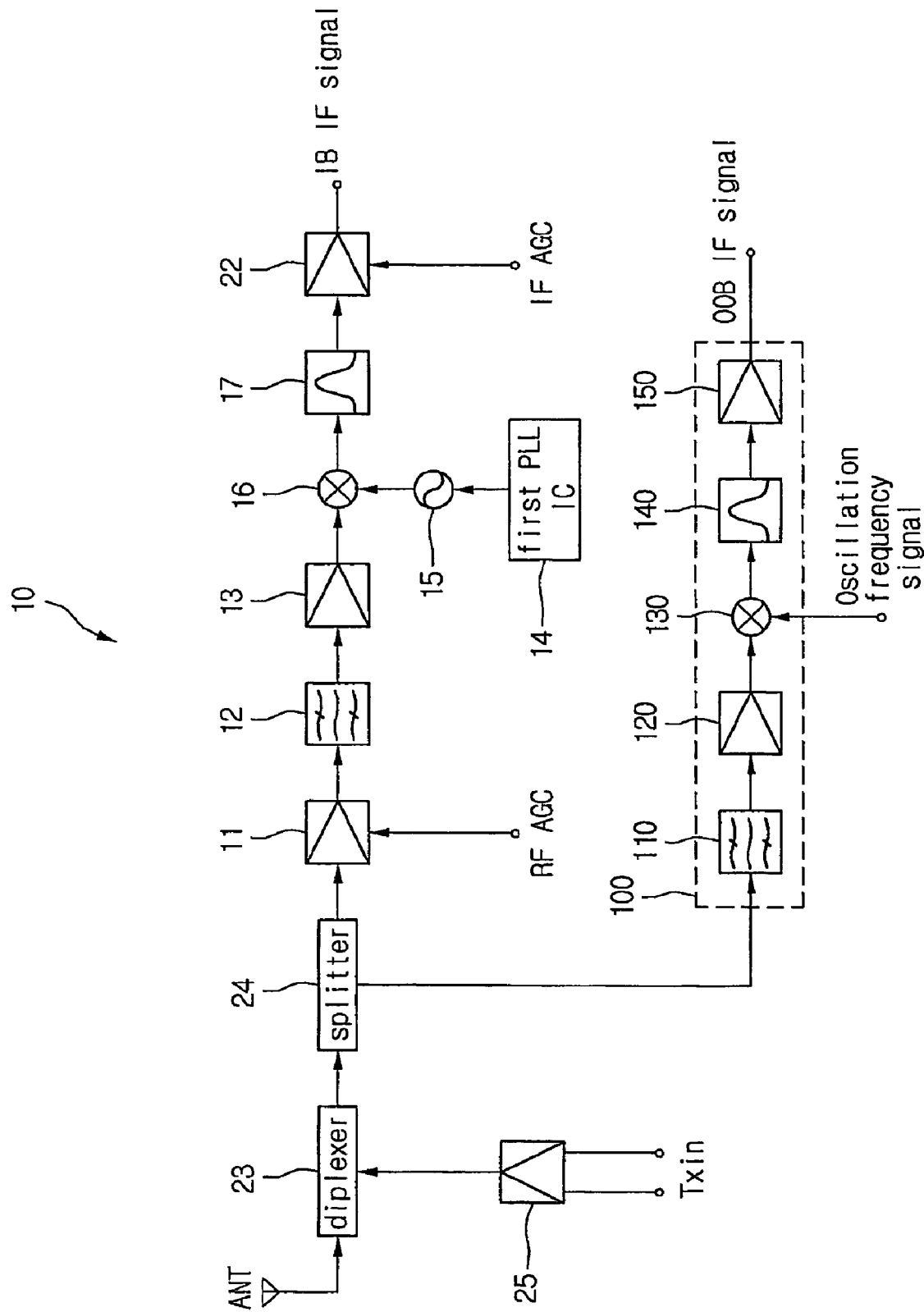
FIG. 1 is a block diagram of a digital tuner according to a first embodiment of the present invention.

FIG. 1 is a block diagram of a digital tuner according to a first embodiment of the present invention.

Referring to FIG. 1, a digital tuner 10 includes an RF automatic gain control (AGC) amplifier 11, an RF filter 12, an RF amplifier 13, a first phase lock loop (PLL) integrated circuit (IC) 14, a first local oscillator 15, a first mixer 16, a first IF surface acoustic wave (SAW) filter 17 and an IF AGC amplifier 22.

Also, the digital tuner 10 includes a diplexer 23 for selectively outputs transmission/reception signal of the digital tuner 10, a splitter 24 for splitting a signal received from the diplexer 23 into different path signals, and an amplifier 25 for amplifying a transmission signal and transmitting the amplified signal to the diplexer 23. Further, the digital tuner 10 includes a mixer circuit 100 for mixing an OOB signal usable as a digital broadcast frequency signal.

In detail, the RF AGC amplifier 11 performs AGC according to an RF AGC signal received from the outside so that a broadcast signal output can be constant even though an RF signal received through an antenna is changed in strength. The RF filter 12 removes a noise of an RF signal received through an antenna, and passes only a desired band signal out of the RF signal. The RF amplifier 13 amplifies the desired band signal from the RF filter 12. The first PLL IC 14 stores channel data therein and outputs a control voltage to the first local oscillator 15 according to outside control signal. The first local oscillator 15 generates an oscillation frequency signal corresponding to a selected channel according to the control voltage and outputs the oscillation frequency signal to the first mixer 16. The first mixer 16 mixes an amplified RF signal from the RF amplifier 13 and the oscillation frequency signal from the first local oscillator 15 into a first IF signal, and outputs the first IF signal to the first IF SAW filter 17. The first IF SAW filter 17 passes only a desired band signal out of the first IF signal. The IF AGC amplifier 22 amplifies the desired band first signal from the first IF SAW filter 17 into an IB IF signal of a desired level according to an IF AGC signal received from the outside.

An operation of the digital tuner 10 will now be described in detail with reference to FIG. 1.

First, the digital tuner 10 receives a TV signal through the antenna, the diplexer 23 and the splitter 24, and selects a desired channel signal out of the TV signal through the RF AGC amplifier 11, the RF filter 12 and the RF amplifier 13 to thereby generate a somewhat tuned waveform signal. The tuned waveform signal is mixed into a first IF signal by the first PLL IC 14, the first local oscillator 15 and the first mixer 16, and the first IF signal is converted into a first IF frequency signal of a desired band by the first IF SAW filter 17. The first IF frequency signal is gain-controlled by the IF AGC amplifier 22 and outputted to the outside of the digital tuner 10.

In the meantime, the OOB mixer circuit 100 is constructed to include a low pass filter (LPF) 110, an attenuator 120, an OOB mixer 130, an OOB IF SAW filter 140 and an OOB IF AGC amplifier 150.

In detail, the LPF 110 passes only a RF signal of a predetermined band or below out of an RF signal received from the splitter 24. The attenuator 120 attenuates a level of the RF signal from the LPF 110. The COB mixer 130 mixes the level-attenuated signal from the attenuator 120 and an oscillation frequency signal from a demodulator IC (not shown) built in the set into an OOB IF signal. The OOB IF SAW filter 140 passes only a desired band RF signal out of the OOB IF signal received from the OOB mixer 130. The OOB IF AGC amplifier 150 amplifies an OOB IF signal received from the OOB IF SAW filter 140 into an OOB IF signal of a desired level, and outputs the amplified OOB IF signal through an OOB output line to the outside of the digital tuner 10.

An operation of the OOB mixer circuit will now be described in detail with reference to FIG. 1.

First, when an received RF signal is split by the splitter 24 and the split RF signal is inputted to the LPF 110, the LPF 110 only passes an RF signal of a predetermined band or below out of the inputted RF signal and outputs the RF signal to the attenuator 120. The attenuator 120 attenuates a level of the RF signal by a predetermined level. The OOB mixer 130 mixes the level-attenuated RF signal from the attenuator 120 and an oscillation frequency signal from the demodulator IC into an OOB IF signal. At this time, an OOB IF channel is selected by the oscillation frequency signal from the demodulator IC.

In the meantime, a selected OOB IF signal is passed through the OOB IF SAW filter 140, and the passed OOB IF signal is gain-controlled by the OOB IF AGC amplifier 150 according to its strength, and then the gain-controlled OOB IF signal is outputted through the OOB output line to the outside of the digital tuner 10.

Consequently, the digital tuner 10 finally and simultaneously outputs the OOB IF signal and the IB IF signal to thereby make it possible to increase the convenience of the set's user and manufacturer.

However, the digital tuner 10 according to the first embodiment adopts a single conversion mode using the first PLL IC 14, the first local oscillator 15 and the first mixer 16 to thus have a low frequency selectivity.

Second Embodiment

The second embodiment is proposed to eliminate the above drawback of the first embodiment, and is characterized in that it adopts a double conversion mode.

The second embodiment will now be described in detail, but a description of its contents overlapped with those of the first embodiment will be omitted for simplicity.

Figure 2:
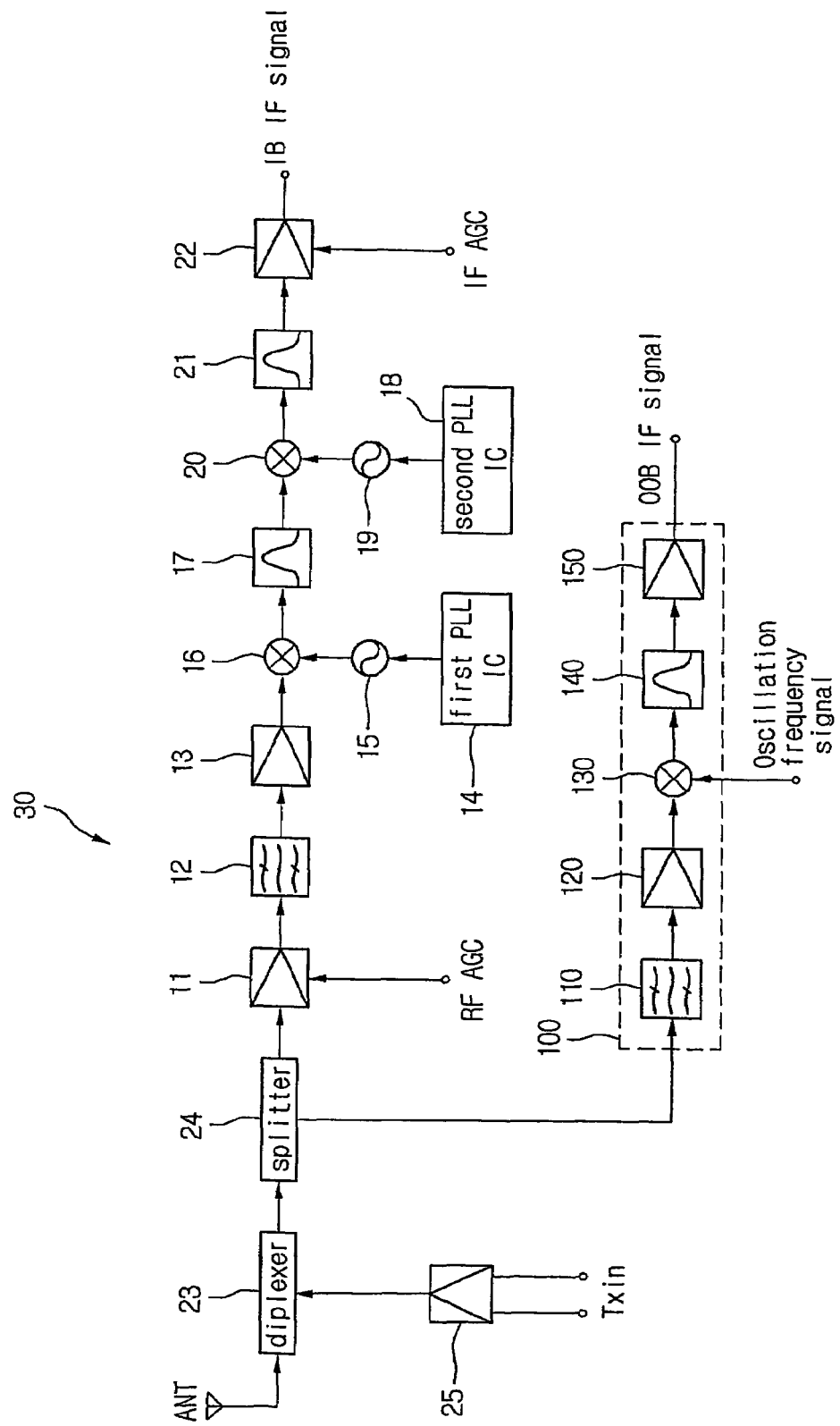
FIG. 2 is a block diagram of a digital tuner according to a second embodiment of the present invention.

FIG. 2 is a block diagram of a digital tuner according to a second embodiment of the present invention.

Referring to FIG. 2, when compared to the digital tuner 10, a digital tuner 30 according to the second embodiment further includes a second IF unit including a second PLL IC 18, a second local oscillator 19, a second mixer 20 and a second IF SAW filter 21, to thus re-convert a converted signal.

In detail, the second PLL IC 18 stores channel data therein, and outputs a control voltage to the second local oscillator 19 according to an outside control signal. The second local oscillator 19 generates a fixed oscillation frequency signal according to the control voltage and outputs the fixed oscillation frequency signal to the second mixer 20. The second mixer 20 mixes a first IF signal from the first IF SAW filter 17 and the fixed oscillation frequency signal from the second local oscillator 19 into a second IF signal, and outputs the second IF signal to the second IF SAW filter 21. The second IF SAW filter 21 passes only a desired band signal out of the second IF signal.

An operation of the second embodiment will now be described.

In the second embodiment, an operation prior to the second mixer 20 is identical to that of the first embodiment. The first IF signal from the first IF SAW filter 17 is down-converted into a final IF signal by the second IF unit, and the final IF signal is transmitted to an inside of the set.

Also, an operation of the OOB mixer circuit 100 is identical to that of the first embodiment, and thus will not be described for simplicity.

Third Embodiment

The third embodiment is identical to the second embodiment with the exception that a digital tuner according to the third embodiment further includes a built-in demodulator for converting a received digital broadcast signal into a digital bit stream. The built-in demodulator makes it possible to enhance the digital tuner's own function, and to reduce a manufacturing cost of the digital TV set through mass production of the digital tuner.

Figure 3:
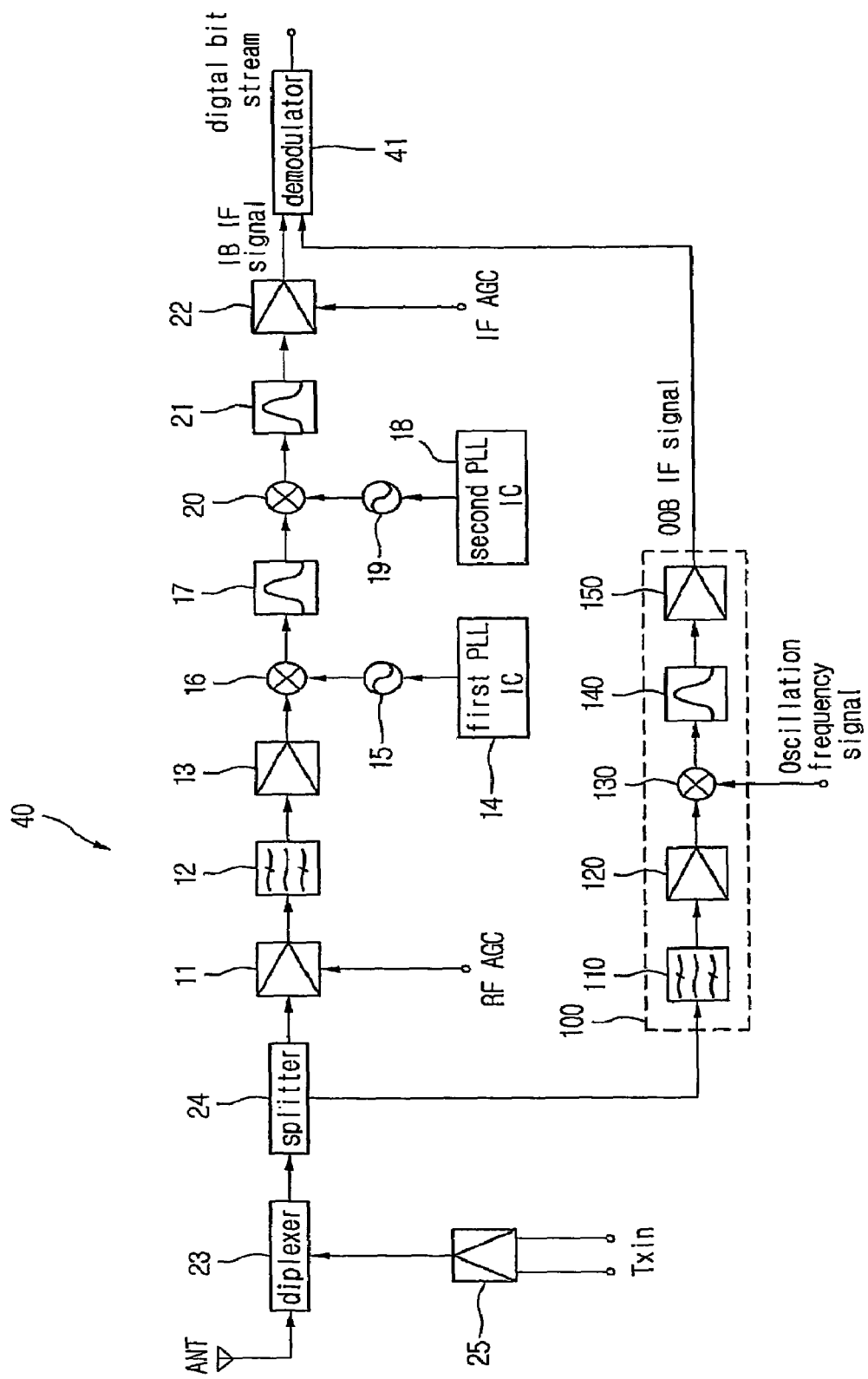
FIG. 3 is a block diagram of a digital tuner according to a third embodiment of the present invention.

FIG. 3 is a block diagram of a digital tuner according to a third embodiment of the present invention.

Referring to FIG. 3, when compared to the digital tuner 30, a digital tuner 40 according to the second embodiment is characterized in that it further includes a built-in demodulator 41 for converting an analog signal into a digital signal.

As stated previously, the demodulator 41 converts a analog TV signal into a digital bit stream, and then determine whether an error occurs or not from the digital bit stream. Here, the demodulator 41 is embodied by a semiconductor chip (or IC). Accordingly, an oscillation frequency signal transmitted to the OOB mixer 130 is transmitted to the demodulator 41, whereby a signal path can be reduced.

In the meantime, the demodulator 41 can simultaneously receive an IB IF signal containing audio/video signals and outputted through the second IF AGC amplifier 22, and an OOB IF signal containing a data signal and outputted through the OOB IF AGC amplifier 150. Also, one of the IB IF signal and the OOB IF signal may be selected and converted into a digital bit stream.

In this manner, the digital tuner 40 has an expanded function and can be functioned as a network interface module between a service provider and an end user.

Fourth Embodiment

The fourth embodiment is identical to the third embodiment with the exception that a digital tuner according to the fourth embodiment adopts a single conversion mode as illustrated in the first embodiment.

Figure 4:
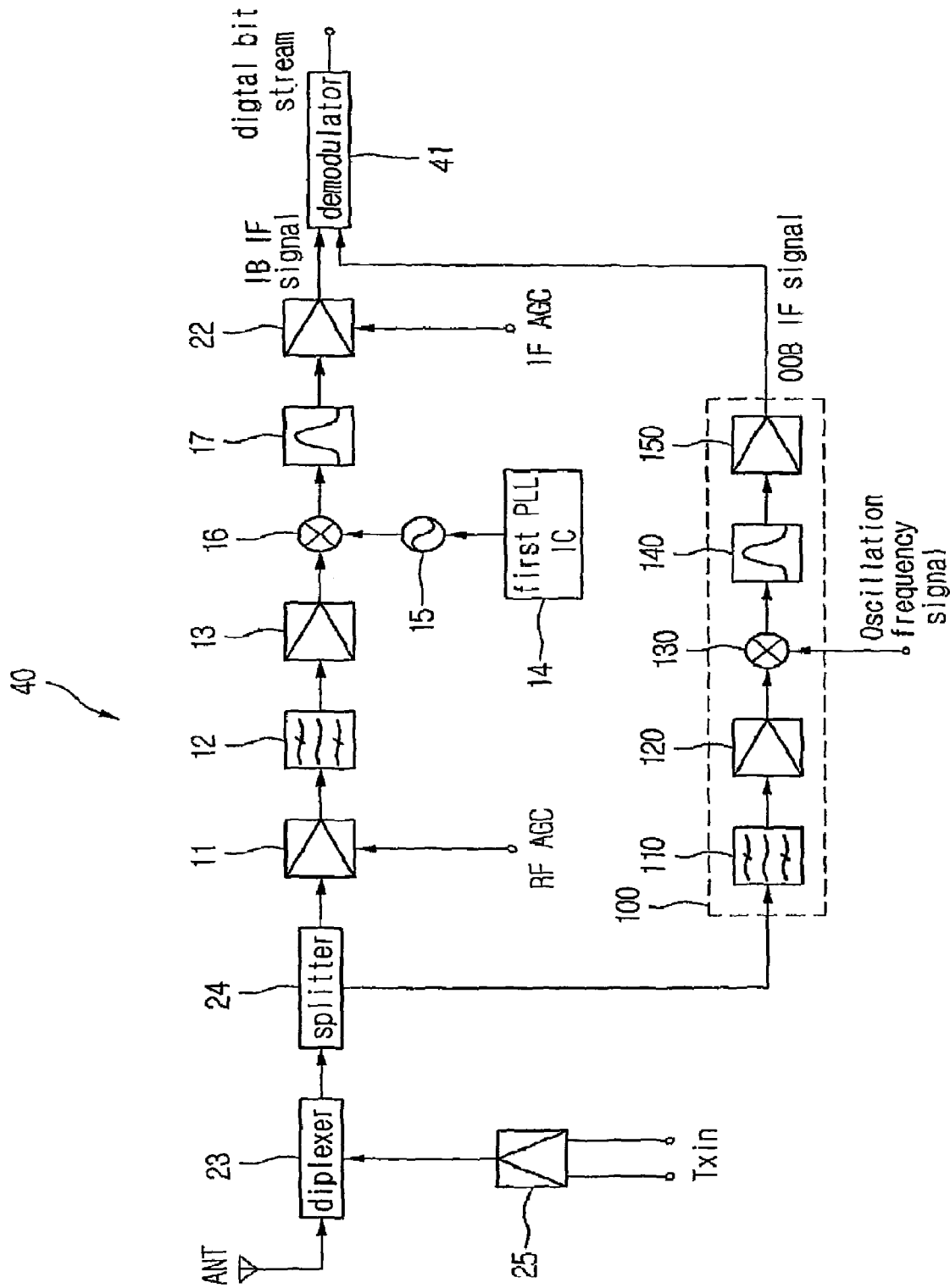
FIG. 4 is a block diagram of a digital tuner according to a fourth embodiment of the present invention.

FIG. 4 is a block diagram of a digital tuner according to a fourth embodiment of the present invention.

Referring to FIG. 4, a digital tuner according to the fourth embodiment does not includes the second IF unit equipped with the second PLL IC 18, the second local oscillator 19, the second mixer 20 and the second IF SAW filter 21.

Since the digital tuner adopts the single conversion mode, it can be conveniently and cheaply embodied in an environment where a high frequency selectivity is not required.

INDUSTRIAL APPLICABILITY

The digital tuner with the built-in OOB mixer circuit according to the present invention finally and simultaneously outputs OOB IF signals and IB IF signals to thereby make it possible to increase the convenience of a user and a manufacturer of a set in which the digital tuner is built.

Also, the digital tuner itself outputs OOB IF signals to thereby make it possible to conveniently manufacture the set.

Further, the digital tuner is attachable to different kinds of sets, whereby mass production thereof is possible. Accordingly, it is possible to reduce a manufacturing cost of each set in which the digital tuner is built. The reduction of the set's manufacturing cost can facilitate the spread of digital TVs.

The invention claimed is:

1. A digital tuner comprising:
   a splitter for splitting a received RF (radio frequency) signal into several RF signal outputs;
   an IB (in-band) IF (intermediate frequency) unit for converting an IB signal of the RF signal output into an IB IF signal;
   an OOB (out-of-band) IF unit for converting an OOB signal of the RF signal output into an OOB IF signal,
   wherein the OOB IF unit comprises:
   a filter for passing a signal of a predetermined band out of an RF signal received through the splitter;
   an OOB mixer for mixing a signal received through the filter and an oscillation frequency signal received from an outside into an OOB IF signal; and
   an OOB IF filter for passing only a signal of a desired band out of the OOB IF signal outputted from the OOB mixer.

2. The digital tuner according to claim 1, further comprising a diplexer connected to a front port of the splitter, for selectively outputting a transmission signal and a reception signal.

3. The digital tuner according to claim 1, wherein the IB IF unit comprises at least one or more IF units.

4. The digital tuner according to claim 1, further comprising a demodulator for demodulating signals outputted from the IB IF unit and/or the OOB IF unit.

5. The digital tuner according to claim 4, wherein the demodulator is made by a semiconductor chip.

6. The digital tuner according to claim 1, wherein the IB IF unit comprises:
   a first IF unit for up-converting a signal; and
   a second IF unit for down-converting the signal from the first IF unit.

7. The digital tuner according to claim 1, wherein the OOB IF unit processes a data signal and the IB IF unit processes audio/video signals.

8. The digital tuner according to claim 1, wherein a signal inputted to the splitter is transmitted by a cable and/or a sky wave and/or a satellite wave.

9. The digital tuner according to claim 1, further comprising an OOB IF amplifier for amplifying an OOB IF signal outputted from the OOB IF filter into an OOB IF signal of a desired level.

10. A digital tuner comprising:
    a splitter for splitting a signal;
    a filter for passing only a signal of a predetermined band or below out of an RF signal received through the splitter;
    an attenuator for attenuating a level of an RF signal outputted from the filter;
    an OOB mixer for mixing a signal received through the attenuator and an oscillation frequency signal received from an outside into an OOB IF signal;

an OOB IF filter for passing only a signal of a desired band out of the OOB IF signal outputted from the OOB mixer; and an OOB IF amplifier for amplifying an OOB IF signal outputted from the OOB IF filter into an OOB IF signal of a desired level.

11. The digital tuner according to claim 10, further comprising a demodulator for demodulating a signal outputted through the OOB IF amplifier in the digital tuner and outputting the demodulated signal to a set.

12. The digital tuner according to claim 10, further comprising an IB IF unit connected to one of branch lines of the splitter, for converting an IB signal into an IF signal.

13. The digital tuner according to claim 12, wherein the IB IF unit comprises at least one or more IF units.

14. A digital tuner comprising:

a filter for passing only a signal of a predetermined band or below out of an RF signal;

an attenuator for attenuating a level of an RF signal outputted from the filter;

an OOB mixer for mixing a signal received through the attenuator and an oscillation frequency signal received from an outside into an OOB IF signal;

an OOB IF filter for passing only a signal of a desired band out of the OOB IF signal outputted from the OOB mixer; and an OOB IF amplifier for amplifying an OOB IF signal outputted from the OOB IF filter into an OOB IF signal of a desired level and outputting the amplified OOB IF signal through an OOB output line thereof.

15. A digital tuner comprising:

a splitter for splitting a received RF (radio frequency) signal into several RF signal outputs;

an IB (in-band) IF (intermediate frequency) unit for converting an IB signal of the RF signal output into an IB IF signal; and an OOB (out-of-band) IF unit for converting an OOB signal of the RF signal output into an OOB IF signal, wherein the OOB IF unit comprises an OOB mixer for mixing an OOB signal and an oscillation frequency signal, and a demodulator for outputting an oscillation frequency of the OOB mixer is built in the digital tuner.

16. A digital tuner comprising:

a splitter for splitting a received RF (radio frequency) signal into several RF signal outputs;

an IB (in-band) IF (intermediate frequency) unit for converting an IB signal of the RF signal output into an IB IF signal;

an OOB (out-of-band) IF unit for converting an OOB signal of the RF signal output into an OOB IF signal, wherein the OOB IF unit comprises:

an OOB mixer for mixing a signal received through the splitter and an oscillation frequency signal received from an outside into an OOB IF signal;

an OOB IF filter for passing only a signal of a desired band out of the OOB IF signal outputted from the OOB mixer; and an OOB IF amplifier for amplifying an OOB IF signal outputted from the OOB IF filter into an OOB IF signal of a desired level.

17. The digital tuner according to claim 16, further comprising:

a filter for passing a signal of a predetermined band out of an RF signal received through the splitter; and an attenuator for attenuating a level of an RF signal outputted from the filter.

\* \* \* \* \*